United States Patent
Chu et al.

(10) Patent No.: US 9,929,760 B2
(45) Date of Patent: Mar. 27, 2018

(54) ULTRA-LOW-POWER RF RECEIVER FRONTEND WITH TUNABLE MATCHING NETWORKS

(71) Applicant: Taiwan Semiconductor Manufacturing Co., Ltd., Hsinchu (TW)

(72) Inventors: Hong-Lin Chu, Taipei (TW); Hsieh-Hung Hsieh, Taipei (TW); Tzu-Jin Yeh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/098,784

(22) Filed: Apr. 14, 2016

(65) Prior Publication Data
US 2017/0302316 A1    Oct. 19, 2017

(51) Int. Cl.
*H04B 1/18* (2006.01)
*H04B 1/10* (2006.01)
(Continued)

(52) U.S. Cl.
CPC .......... *H04B 1/1036* (2013.01); *H03F 3/193* (2013.01); *H03F 3/45071* (2013.01);
(Continued)

(58) Field of Classification Search
CPC ... H04L 25/063; H04L 25/061; H04L 25/062; H04L 25/06; H03K 5/086
(Continued)

(56) References Cited

U.S. PATENT DOCUMENTS

| | | | |
|---|---|---|---|
| 6,414,562 B1 * | 7/2002 | Bouisse | H03H 7/40 333/17.3 |
| 6,445,248 B1 * | 9/2002 | Gilbert | H03F 3/72 330/254 |

(Continued)

OTHER PUBLICATIONS

Liu et al., "A 1.9nJ/b 2.4GHz Multistandard (Bluetooth Low Energy/Zigbee/IEEE802.15.6) Transceiver for Personal/Body-Area Networks," *IEEE International Solid-State Circuits Conference*, 3 pages (2013).

(Continued)

*Primary Examiner* — James M Perez
(74) *Attorney, Agent, or Firm* — Sterne, Kessler, Goldstein & Fox P.L.L.C.

(57) ABSTRACT

A tunable matching circuit for use with ultra-low power RF receivers is described to support a variety of RF communication bands. A switched-capacitor array and a switched-resistor array are used to adjust the input impedance presented by the operating characteristics of transistors in an ultra-low-power mode. An RF sensor may be used to monitor performance of the tunable matching circuit and thereby determine optimal setting of the digital control word that drives the switched-capacitor array and switched-resistor array. An effective match over a significant bandwidth is achievable. The optimal matching configuration may be updated at any time to adjust to changing operating conditions. Memory may be used to store the optimal matching configurations of the switched capacitor array and switched resistor array.

20 Claims, 8 Drawing Sheets

(51) Int. Cl.
*H03F 3/193* (2006.01)
*H03H 19/00* (2006.01)
*H03F 3/45* (2006.01)

(52) U.S. Cl.
CPC ..... *H03H 19/004* (2013.01); *H03F 2200/171* (2013.01); *H03F 2200/222* (2013.01); *H03F 2200/294* (2013.01); *H03F 2200/336* (2013.01); *H03F 2200/451* (2013.01); *H03F 2203/45288* (2013.01)

(58) Field of Classification Search
USPC .......................... 375/316–352; 455/130–355
See application file for complete search history.

(56) References Cited

U.S. PATENT DOCUMENTS

| | | | | |
|---|---|---|---|---|
| 6,724,890 | B1* | 4/2004 | Bareis | H04M 1/76 379/394 |
| 7,355,476 | B2* | 4/2008 | Kasha | H04B 1/18 330/284 |
| 7,495,515 | B1* | 2/2009 | Branch | H03F 1/56 330/302 |
| 7,599,675 | B2* | 10/2009 | Mu | H03D 7/1441 375/345 |
| 7,826,549 | B1* | 11/2010 | Aggarwal | H03C 1/60 332/170 |
| 8,111,105 | B1* | 2/2012 | Zhou | H03F 1/223 330/300 |
| 8,190,109 | B2* | 5/2012 | Ali | H01Q 1/243 455/123 |
| 8,279,008 | B2* | 10/2012 | Hsieh | H03F 1/223 330/285 |
| 8,285,220 | B2* | 10/2012 | Cha | H04B 17/21 455/107 |
| 8,295,018 | B2* | 10/2012 | Hsieh | H03F 1/52 361/118 |
| 8,358,156 | B1* | 1/2013 | Abugharbieh | H03K 19/017554 327/108 |
| 8,427,240 | B2* | 4/2013 | Hsieh | H03F 1/223 330/278 |
| 8,432,234 | B2* | 4/2013 | Manssen | H03H 7/40 333/17.3 |
| 8,593,206 | B2* | 11/2013 | Chen | H03D 7/1441 327/356 |
| 8,610,494 | B1* | 12/2013 | Jin | H03H 7/0115 327/557 |
| 8,618,631 | B2* | 12/2013 | Jin | H01L 23/5227 257/277 |
| 8,626,083 | B2* | 1/2014 | Greene | H01Q 5/314 315/151 |
| 8,693,963 | B2* | 4/2014 | du Toit | H01P 5/04 333/17.3 |
| 8,699,973 | B2* | 4/2014 | Southcombe | H03F 1/0227 375/297 |
| 8,731,498 | B2* | 5/2014 | Southcombe | H03F 1/0227 323/207 |
| 8,860,525 | B2* | 10/2014 | Manssen | H03H 7/40 333/17.3 |
| 8,912,581 | B2 | 12/2014 | Lin et al. | |
| 8,941,212 | B2 | 1/2015 | Yen et al. | |
| 8,971,831 | B2* | 3/2015 | Vidojkovic | H03F 3/45071 330/109 |
| 9,002,278 | B2* | 4/2015 | Anderson | H04B 1/18 343/745 |
| 9,042,844 | B2* | 5/2015 | Yu | H04B 1/44 330/196 |
| 9,136,899 | B2* | 9/2015 | Chakraborty | H04B 1/40 |
| 9,154,166 | B2* | 10/2015 | Darabi | H04B 1/52 |
| 9,184,256 | B2 | 11/2015 | Huang et al. | |
| 9,184,707 | B2* | 11/2015 | Rangarajan | H03F 3/72 |
| 9,209,521 | B2 | 12/2015 | Hung et al. | |
| 9,306,603 | B2* | 4/2016 | Lee | H04B 1/0053 |
| 9,319,001 | B2* | 4/2016 | Ding | H03F 1/301 |
| 9,319,009 | B2* | 4/2016 | Connell | H03F 1/223 |
| 9,344,124 | B2* | 5/2016 | Lau | H03F 1/26 |
| 9,356,639 | B1* | 5/2016 | Chapman | H04B 1/28 |
| 9,374,043 | B2* | 6/2016 | Wang | H03F 1/26 |
| 9,374,113 | B2* | 6/2016 | Greene | H04B 1/18 |
| 9,379,673 | B2* | 6/2016 | Wang | H03F 1/32 |
| 9,407,215 | B2* | 8/2016 | Gill | H03F 3/195 |
| 9,425,746 | B2* | 8/2016 | Uzunkol | H03F 1/0211 |
| 9,479,126 | B2* | 10/2016 | Ilkov | H03F 1/565 |
| 9,479,131 | B2* | 10/2016 | Youssef | H03G 1/0029 |
| 9,503,160 | B1* | 11/2016 | Hyde | H04B 5/0087 |
| 9,537,457 | B2* | 1/2017 | Issakov | H03F 3/265 |
| 9,544,864 | B1* | 1/2017 | Takahashi | H04W 56/0015 |
| 9,548,715 | B2* | 1/2017 | Van Liempd | H03F 3/265 |
| 9,564,935 | B2* | 2/2017 | Kurihara | H03F 3/245 |
| 9,590,572 | B2* | 3/2017 | Rada | H03F 3/193 |
| 9,590,676 | B2* | 3/2017 | Wu | H04B 1/18 |
| 9,602,055 | B1* | 3/2017 | Haridy | H03D 7/1441 |
| 2004/0253939 | A1* | 12/2004 | Castaneda | H03F 3/45188 455/341 |
| 2005/0198687 | A1* | 9/2005 | Miller | H04M 11/066 725/127 |
| 2006/0009165 | A1* | 1/2006 | Alles | H04B 1/44 455/88 |
| 2008/0261544 | A1* | 10/2008 | Blin | H01Q 1/242 455/121 |
| 2009/0010310 | A1* | 1/2009 | Rofougaran | H03D 3/244 375/135 |
| 2009/0190640 | A1* | 7/2009 | Floyd | G01R 31/2841 375/224 |
| 2009/0251618 | A1* | 10/2009 | Gao | H03J 5/244 348/731 |
| 2010/0284452 | A1* | 11/2010 | Allen | H04L 7/0008 375/220 |
| 2011/0183628 | A1* | 7/2011 | Baker | H03L 7/085 455/67.14 |
| 2011/0233678 | A1* | 9/2011 | Tsai | H01L 27/0255 257/357 |
| 2011/0267144 | A1* | 11/2011 | Behera | H03F 3/189 330/260 |
| 2011/0299632 | A1* | 12/2011 | Mirzaei | H04B 1/006 375/340 |
| 2012/0032743 | A1* | 2/2012 | Hsieh | H03F 1/223 330/285 |
| 2012/0134394 | A1* | 5/2012 | Allen | H04L 7/0008 375/219 |
| 2012/0184233 | A1* | 7/2012 | Jones | H03F 1/0227 455/234.1 |
| 2013/0027088 | A1* | 1/2013 | Francese | H03K 5/24 327/74 |
| 2013/0059556 | A1* | 3/2013 | Molnar | H03G 3/3052 455/234.1 |
| 2013/0241634 | A1* | 9/2013 | Hsieh | H01L 23/48 327/564 |
| 2013/0271221 | A1* | 10/2013 | Levesque | H03F 3/193 330/294 |
| 2014/0077878 | A1* | 3/2014 | Hsieh | H03F 1/223 330/254 |
| 2014/0132333 | A1* | 5/2014 | Jin | H03K 17/693 327/409 |
| 2014/0169510 | A1* | 6/2014 | Mikhemar | H04B 1/00 375/345 |
| 2014/0204985 | A1* | 7/2014 | Cowley | H03D 7/1466 375/219 |
| 2014/0253262 | A1 | 9/2014 | Hsieh et al. | |
| 2014/0253391 | A1 | 9/2014 | Yen | |
| 2014/0355655 | A1* | 12/2014 | Chakraborty | H04B 1/40 375/219 |
| 2015/0230185 | A1* | 8/2015 | Vahid Far | H04W 52/0274 455/571 |
| 2015/0341007 | A1* | 11/2015 | Youssef | H03G 1/0029 330/278 |

(56) References Cited

U.S. PATENT DOCUMENTS

2015/0349724 A1\* 12/2015 Wang .................... H03F 1/32
330/285
2015/0364417 A1  12/2015 Lee
2016/0036392 A1\*  2/2016 Bohsali ................. H03F 1/26
375/340

OTHER PUBLICATIONS

Selvakumar et al., "A 600μW Bluetooth Low-Energy Front-End Receiver in 0.13μm CMOS Technology," *IEEE International Solid-State Circuits Conference*; 3 pages (2015).

Wang, et al., "A 1.8mW PLL-Free Channelized 2.4GHz ZigBee Receiver Utilizing Fixed-LO Temperature-Compensated FBAR Resonator," *IEEE International Solid-State Circuits Conference*, 3 pages (2014).

\* cited by examiner

ULTRA-LOW-POWER RF RECEIVER FRONTEND WITH TUNABLE MATCHING NETWORKS

BACKGROUND

This disclosure generally relates to the field of RF receivers.

Power consumption is an important design consideration in a wireless device since a reduced power consumption results in an increased battery life. RF transceivers are employed in many modern wireless devices, such as cellular telephones, personal data assistants, and smart phones. RF receiver front-end circuits typically use a relatively large amount of DC power, and therefore it is desirable to reduce the DC power consumption of the RF receiver front-end circuit in order to reduce the overall DC power consumption of the wireless transceiver.

In addition to addressing the DC power consumption design requirement of a receiver front-end circuit, an RF receiver front-end circuit must also effectively couple the input RF signal from the antenna into the low noise amplifier (LNA) for subsequent processing by the down conversion circuitry. Effective coupling of the input RF signal typically depends on the operating point of the low noise amplifier. However, an operating point chosen to meet the low DC power consumption requirement may not support effective coupling of the input RF signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Embodiments of the present disclosure will be described with reference to the accompanying drawings.

DETAILED DESCRIPTION

Figure 1:
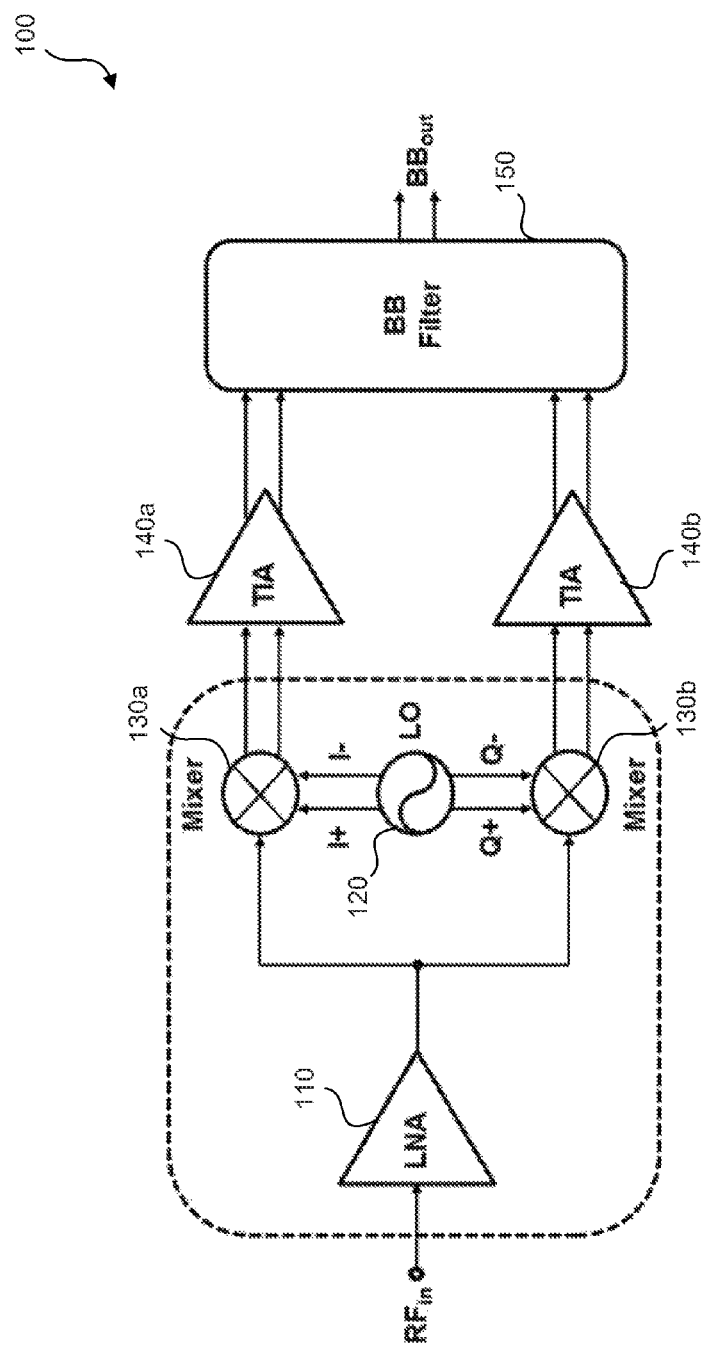
FIG. 1 is a block diagram of a front end of a wireless receiver.

FIG. 1 depicts a general block diagram of a RF receiver front-end circuit 100. RF receiver 100 receives a signal, $RF_{in}$, usually via an antenna (not shown). RF receiver front-end circuit 100 includes a low noise amplifier (LNA) 110, a local oscillator (LO) 120, and an in-phase processing chain and a quadrature processing chain. The in-phase processing chain includes in-phase mixer 130a, and transimpedance amplifier (TIA) 140a. Quadrature processing chain includes quadrature mixer 130b, and TIA 140b. LO 120 provides oscillator signals I+ and I− to in-phase mixer 130a. LO 120 also provides oscillator signals Q+ and Q− to quadrature mixer 130b. Quadrature oscillator signals Q+ and Q− are at the same frequency as, but are 90 degrees out of phase with, in-phase oscillator signals I+ and I−.

In-phase mixer 130a mixes the amplified input RF signal with in-phase oscillator signals I+ and I− to down-convert the amplified input RF signal to a desired frequency, e.g., an intermediate frequency (IF) or baseband frequency. In the mixing process, the oscillator signal interacts with the input RF signal to produce outputs known as mixing products at frequencies which are equal to the sum of the two input frequencies and difference of the two input frequencies. Other mixing products are also produced that are integer multiples of the sum and difference products, and are generally lower in amplitude than the sum and difference products. Furthermore, the sum product is typically attenuated significantly with respect to the difference product by virtue of the low-pass filtering of the higher-frequency sum product. Should the unwanted products require further attenuation, additional filtering may be used in certain embodiments. Similarly, quadrature mixer 130b mixes the amplified input RF signal with quadrature oscillator signals Q+ and Q− to down-convert the amplified input RF signal to the same desired frequency, e.g., an intermediate frequency (IF) or baseband (BB) frequency. TIA 140a amplifies the in-phase baseband current signals, and also converts them into in-phase baseband voltage signals. Similarly, TIA 140b amplifies the down-converted quadrature baseband current signals, and also converts them into quadrature baseband (BB) voltage signals. Baseband filter 150 receives the voltage output signals from TIA 140a and TIA 140b, and filters those signals to provide an output baseband signal $BB_{out}$. Filtering by baseband filter 150 serves to remove any spurious signals introduced by the down-conversion process. RF receiver front-end circuit 100 may be used in any wireless device that wirelessly receives signals according to any known wireless standard or protocol.

In an embodiment, the system architecture of FIG. 1 may be implemented as an ultra-low-power RF receiver. In an embodiment of such an ultra-low-power RF receiver, the mixers may be passive mixers, and the active devices (e.g., transistors) within LNA 110 may be powered with a low supply voltage $V_{DD}$. For example, the supply voltage $V_{DD}$ may be as low as 0.8V. However, given the knee or corner in the current-voltage characteristics of semiconductor active devices, such a low supply voltage may severely limit the linearity performance of the active devices in LNA 110. Operating a semiconductor device with such a low supply voltage constitutes an ultra-low-power mode of operation. In order to address the linearity performance problem in this mode of operation, LNA 110 may employ a current-mode operation, rather than a voltage-mode operation. In a current-mode operation, LNA 110 transduces the input voltage signal, $RF_{in}$, into an output current signal for input to mixers 130a, 130b for subsequent frequency down-conversion. Using a current-mode approach also provides the further advantage of a reduced chip area design since a shunt inductor is no longer required between LNA 110 and down-conversion mixers 130a, 130b in order to provide an appropriate output voltage signal level by LNA 110.

Figure 2:
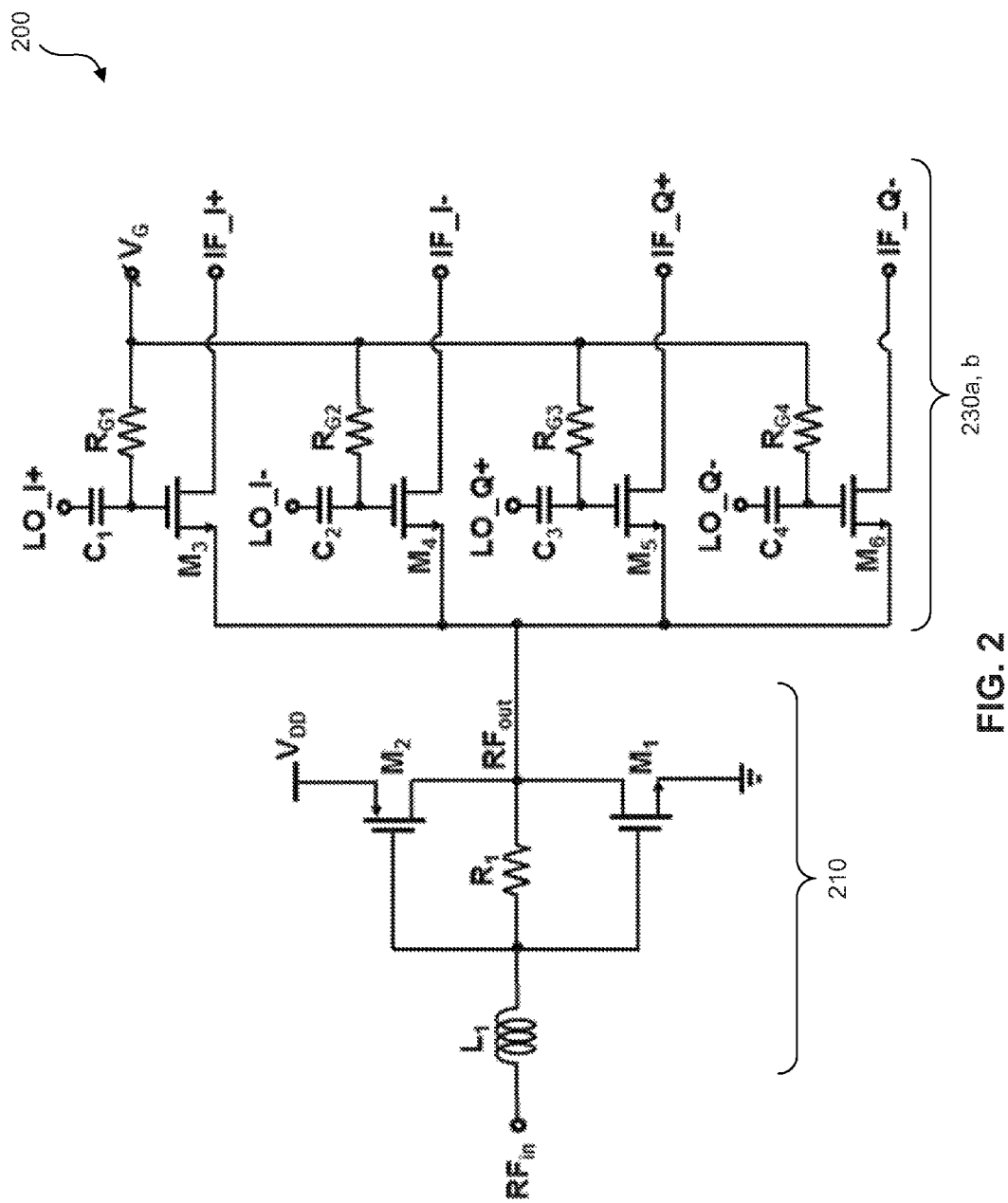
FIG. 2 is a circuit schematic for a front end of a wireless receiver.

Various circuits may implement the system architecture shown in FIG. 1. FIG. 2 depicts a circuit schematic of an embodiment of a current-mode ultra-low-power RF receiver front-end circuit 200. RF receiver front-end circuit 200 includes a complementary LNA 210 and I/Q passive down-conversion mixers 230a, b. LNA 210 includes an n-channel transistor $M_1$ and a p-channel transistor $M_2$ that are configured to form a complementary amplifier. The term "complementary" amplifier refers to the use of two types of transistors in series. In another embodiment of a complementary amplifier, $M_1$ may be a p-channel transistor and $M_2$ an n-channel transistor. N-channel transistor $M_1$ and p-channel transistor $M_2$ are connected in series so that the current is used (or "re-used") by both transistors. This current "re-use" configuration reduces DC power consumption than what would be otherwise required by the two transistors. With LNA 210, the input RF voltage signal, $RF_{in}$, of LNA 210 is transduced to provide an output RF current, $RF_{out}$. The transducer gain of LNA 210 is given by the total transconductance gain of $(g_{mn}+g_{mp})$, where $g_{mn}$ and $g_{mp}$ represent the transconductance of $M_1$ and $M_2$ respectively. Note that resistor $R_1$ in FIG. 2 is used to provide self-biasing of the complementary transistor design that is employed in LNA 210. In an embodiment of LNA 210, a typical value of $R_1$ is around 20 kΩ so as to provide a desired RF choke capability. The inductor $L_1$ in FIG. 2 represents the parasitic inductance that results from the RF input connection, such as on-chip metal routing tracks, bonding wires or flip-chip bumps.

Figure 3:
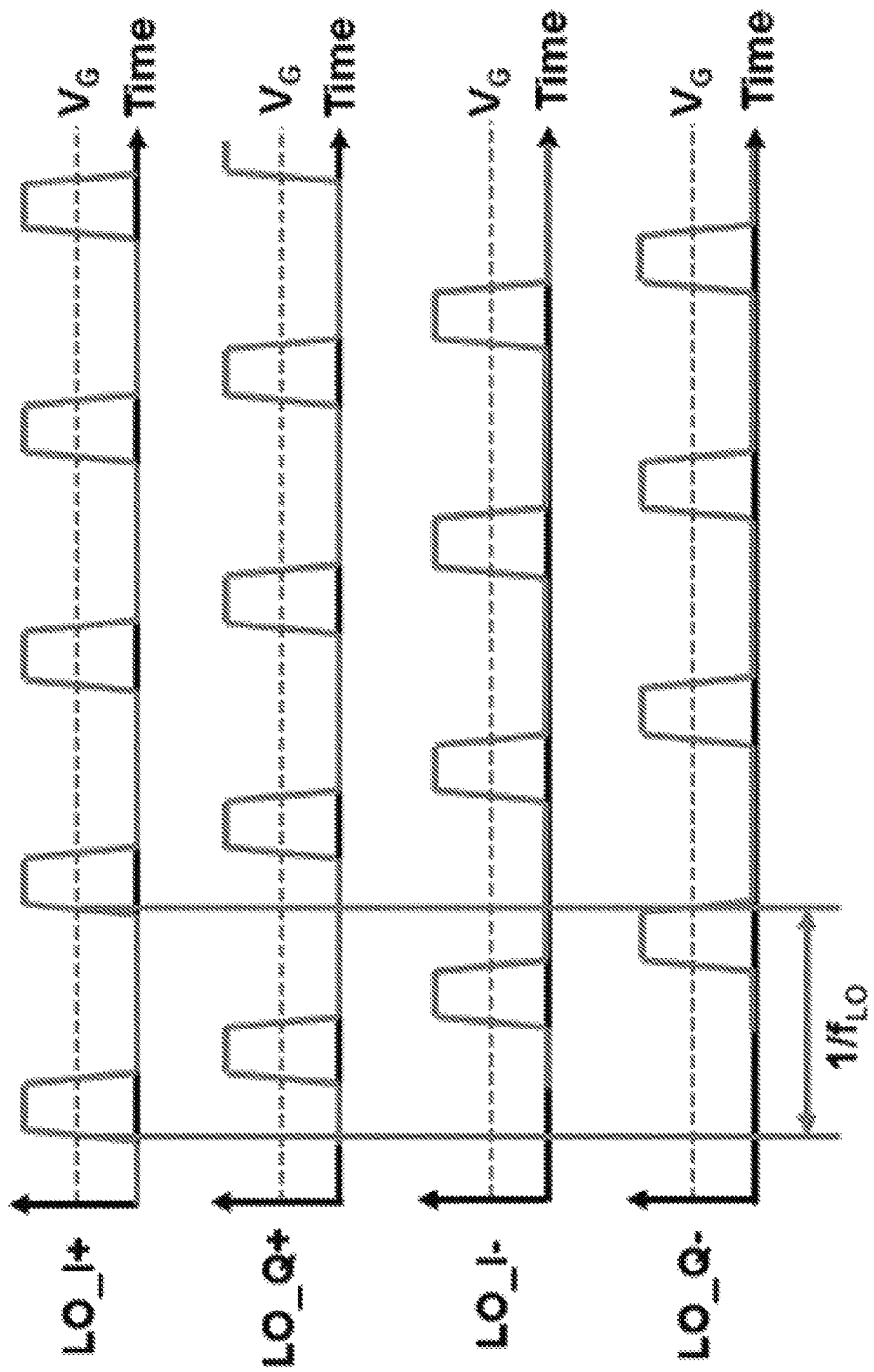
FIG. 3 illustrates the local oscillator waveforms as a function of time, in accordance with some embodiments.

Down-conversion mixers 230a, 230b are implemented in FIG. 2 as follows. As noted above, down-conversion mixers 230a, 230b provide in-phase/quadrature passive down-conversion and thereby convert the RF current signal from LNA 210 into the corresponding baseband current signals: IF_I+, IF_I−, IF_Q+, and IF_Q−. Down-conversion mixers 230a, 230b include transistors M3, M4, M5, and M6, each of which are coupled to $RF_{out}$ from LNA 210. Transistors M3, M4, M5, and M6 are driven by a respective local oscillator signal LO_I+, LO_I−, LO_Q+, and LO_Q−. Continuing to refer to FIG. 2, in order to achieve higher linearity under ultra-low-power operation, transistors M3, M4, M5, and M6 are used as switches controlled by the I/Q differential LO signals of LO_I+, LO_I−, LO_Q+, and LO_Q−. A control signal, $V_G$, is also applied to the gate of each transistor M3, M4, M5, and M6 via a respective resistor $R_{G1}$, $R_{G2}$, $R_{G3}$, and $R_{G4}$ respectively. Control signal, $V_G$, permits the transistor switches to perform more smoothly while at the same time the mixer conversion gain may be optimized by an appropriate value of $V_G$. In order to further improve the conversion gain compared to the conversion gain resulting from conventional double-balanced mixers, the duty cycle of the LO signals may be adjusted. For example, FIG. 3 shows an exemplary embodiment where 25% duty-cycle LO signals are employed, where the LO signals have a frequency of $f_{LO}$. As FIG. 3 illustrates, within the period of ($1/f_{LO}$), LO_I+, LO_I−, LO_Q+, and LO_Q− are each active for 25% of the time, where the active periods of time are separated from each other by 90 degrees of phase.

As noted above, effective coupling of the input RF signal is desirable and typically depends on the operating point of the low noise amplifier. The operating point of the low noise amplifier is particularly challenging in the ultra-low-power DC environment. Referring to FIG. 2, the input impedance seen from the input node of signal, $RF_{in}$, varies with operating point of the transistors in the LNA 210. In particular, the input impedance is particularly dependent on the corner (or knee or threshold) of the transistor current-voltage characteristic. This input impedance variation is particularly significant in the near-threshold voltage (NTV) operating regime that occurs in an ultra-low-power environment where the power supply voltage is comparable to the threshold (or knee or corner) of the transistor current-voltage characteristic. Furthermore, the threshold of the transistor operating current-voltage characteristic is not fixed but changes with such factors as frequency of operation, and the impact of other connected components. Consequently, given the variation in the input impedance due to variations in the operating current-voltage characteristic of the transistors in the LNA 210, the input matching varies considerably and a desirable match cannot be maintained. Lack of maintenance of a suitable input match leads to degraded performance of gain and frequency bandwidth of the RF receiver.

Figure 4:
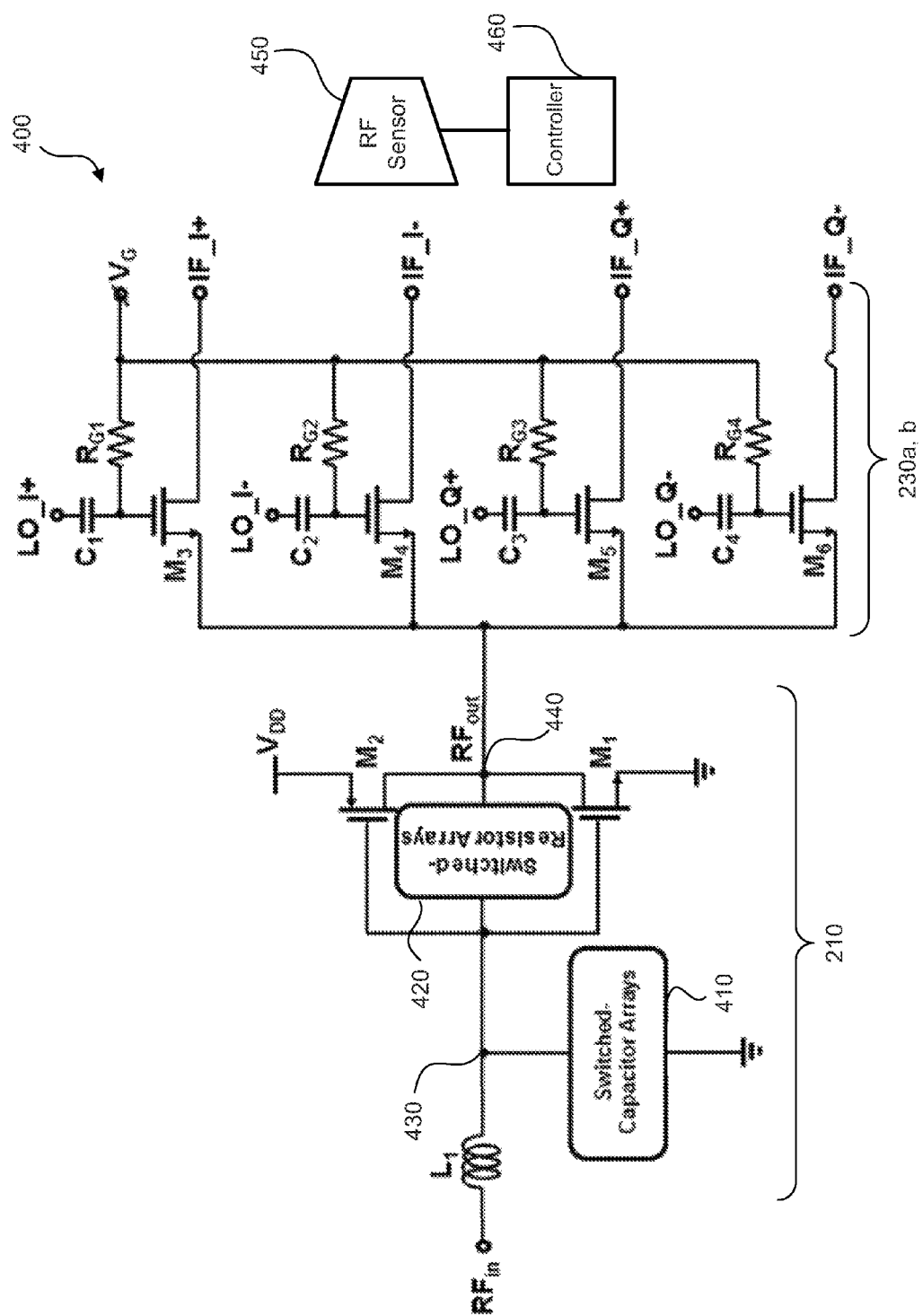
FIG. 4 is a circuit schematic for a front end of a wireless receiver, in accordance with some embodiments.

To address this matching challenge, a tunable matching circuit has been developed. FIG. 4 illustrates an embodiment of a tunable matching circuit 400. Tunable matching circuit 400 includes switched-capacitor array 410 coupled between an input port 430 and ground. Tunable matching circuit 400 also includes switched-resistor array 420 coupled between input port 430 and output port 440. As illustrated in FIG. 4, a switched-capacitor array 410 and a switched-resistor array 420 are employed to provide tunable input matching circuit to address the input impedance variation. Switched-capacitor array 410 is arranged in shunt between inductor L1 and the gate terminals of transistors $M_1$ and $M_2$, while the switched-resistor array 420 is inserted between the gate and drain terminals of transistors $M_1$ and $M_2$. The primary functions of switched-capacitor array 410 and switched-resistor array 420 are to manipulate the imaginary and real parts of the input impedance, as seen from the input node where input signal, $RF_{in}$, enters. The use of this architecture has been found to result in practical values of capacitance and resistance that can match a wide range of input impedances of a low-noise amplifier that is operating in an ultra-low power mode of operation over the frequency ranges of interest. In addition, this architecture also attenuates harmonics, noise and other undesired signals at the front end of this RF circuit.

Figure 5:
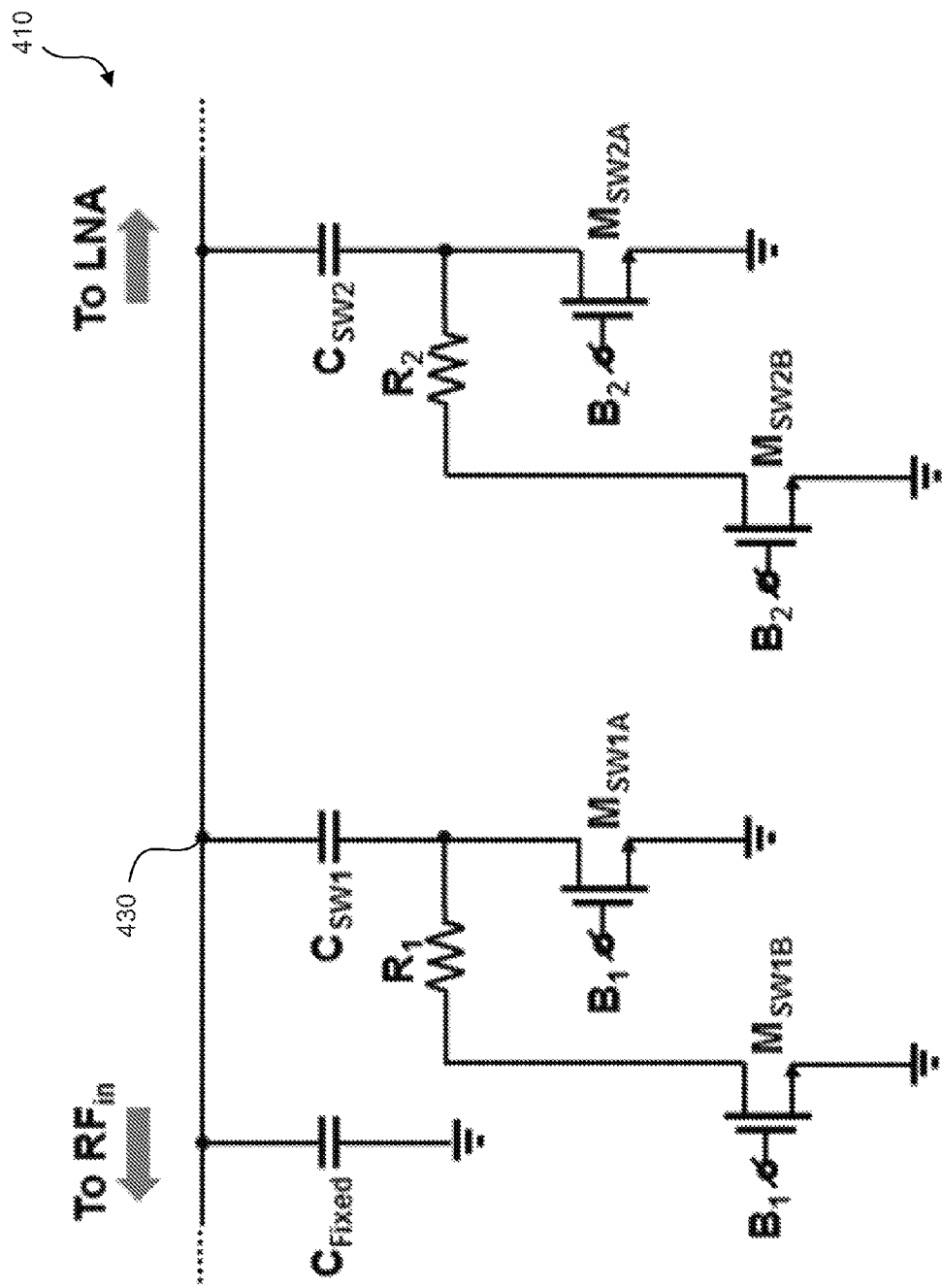
FIG. 5 illustrates a circuit topology for the switched capacitor array of FIG. 4, in accordance with some embodiments.

FIG. 5 illustrates an exemplary embodiment of switched-capacitor array 410. The circuit topology of switched-capacitor array 410 consists of a fixed capacitor $C_{Fixed}$ in parallel with one or more switched-capacitor units. Each switched-capacitor unit includes a capacitor $C_{SWN}$, and switched transistor $M_{SWNA}$ controlled by digital bit value $B_N$. In a further embodiment, resistor $R_N$ and switched transistor $M_{SWNB}$ is included, with switched transistor $M_{SWNB}$ controlled by digital bit value $B_N$. Resistor $R_N$ acts as an RF choke. In a typical embodiment, resistor $R_N$ has a value of 10 kΩ. N may take any positive integer value, i.e., 1, 2, . . . . In the embodiment of FIG. 5, N has the value 2. Switched-capacitor array 410 is turned on by raising digital bit value $B_N$ to become a high value, e.g., logic 1. As the digital bit value $B_N$ of $M_{SWNA}$ and $M_{SWNB}$ becomes the high logical value, e.g., $V_{DD}$, switched transistors $M_{SWNA}$ and $M_{SWNB}$ are turned on, which thereby connect capacitor $C_{SWN}$ to ground. Similarly, when digital bit value $B_N$ is changed to a low logical value, e.g., logic 0, transistors $M_{SWNA}$ and $M_{SWNB}$ are turned off, which thereby disconnects capacitor $C_{SWN}$ from ground. In the case of switched-capacitor array 410 with more than 1 switched-capacitor unit, each switched-capacitor unit has the same topology but the respective capacitor $C_{SWN}$ has a different capacitance value. In addition, each switched-capacitor array 410 is triggered by a different digital bit value $B_N$ of a digital control word. In an exemplary embodiment, each respective capacitor $C_{SWN}$ may have a value that is determined by a binary relationship to a base capacitance value. For example, capacitor $C_{SWN}$ may have the value, $2^{N-1}$ C, where C is the base capacitance value. Other embodiments may use a different relationship between the capacitances of the switched-capacitor units. Although only one transistor, e.g., $M_{SWNA}$ is required, the embodiment that includes transistor $M_{SWNB}$ in series with resistor $R_N$, ensures that the operating point of $M_{SWNA}$ is well-defined irrespective of individual variations in transistors, thereby resulting in a superior transistor switch performance.

Figure 6:
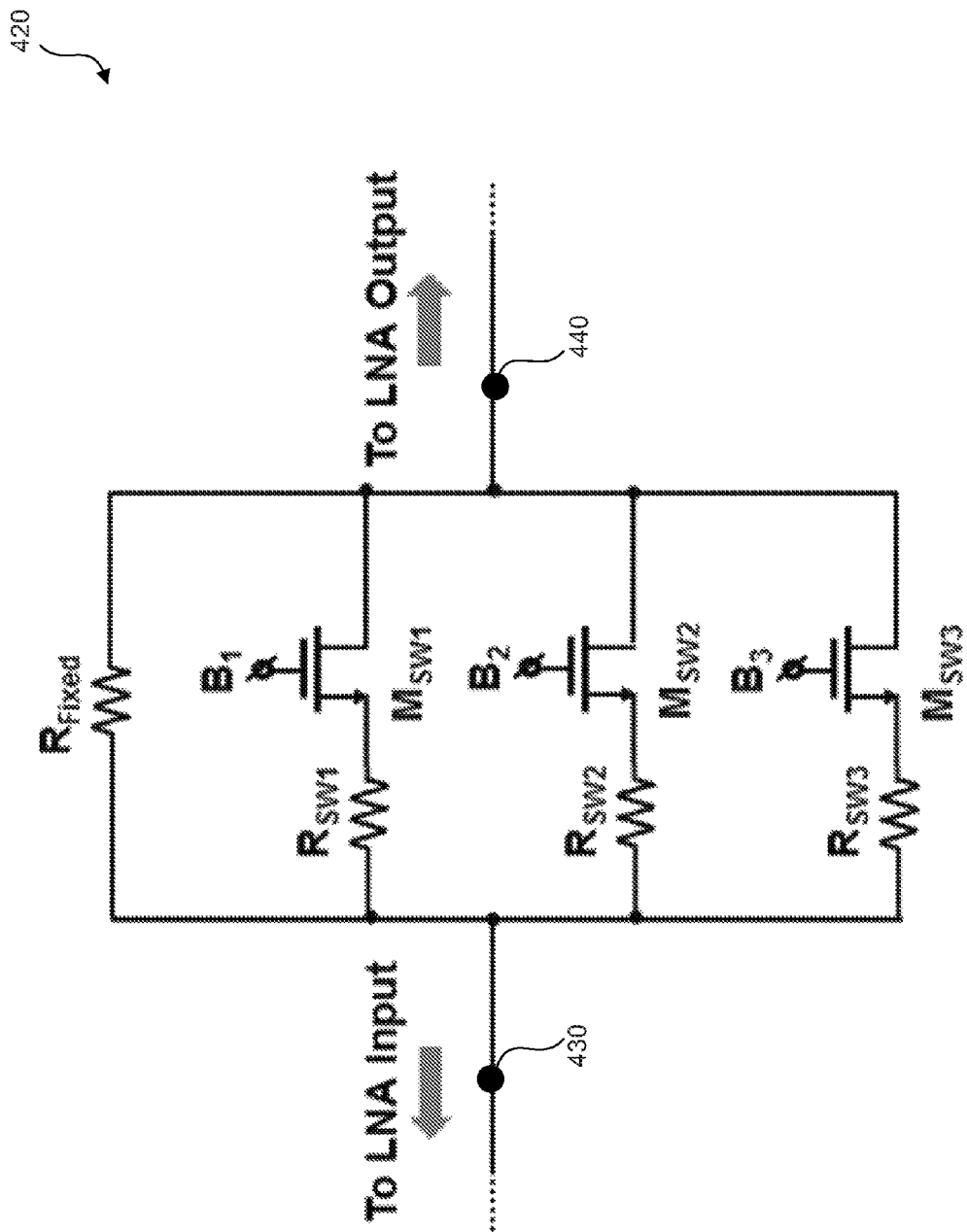
FIG. 6 illustrates a circuit topology for the switched resistor array of FIG. 4, in accordance with some embodiments.

FIG. 6 illustrates an exemplary embodiment of switched-resistor array 420. The circuit topology of switched-resistor array 420 consists of a fixed resistor $R_{Fixed}$ in parallel with one or more switched-resistor units. Each switched-resistor unit includes a resistor $R_{SWP}$ and a switched transistor $M_{SWP}$ controlled by digital bit value $B_P$. P may take any positive integer value, i.e., 1, 2, . . . . In an exemplary embodiment shown in FIG. 6, P has the value 3. Switched-resistor unit is turned on by raising digital bit value $B_P$ to become a high value, e.g., logic 1. As the digital bit value $B_P$ of $M_{SWP}$ becomes logic 1, resistor $R_{SWP}$ becomes coupled in parallel with $R_{Fixed}$, and manipulates the real part of input impedance, as seen from the node of input of the $RF_{in}$ signal in FIG. 4. Similarly, when digital bit value $B_P$ is changed to a low value, e.g., logic 0, resistor $R_{SWP}$ is decoupled from a parallel connection with $R_{Fixed}$, which thereby decouples resistor $R_{SWP}$ from the rest of the circuit, and therefore unavailable for tunable input matching.

Figure 7:
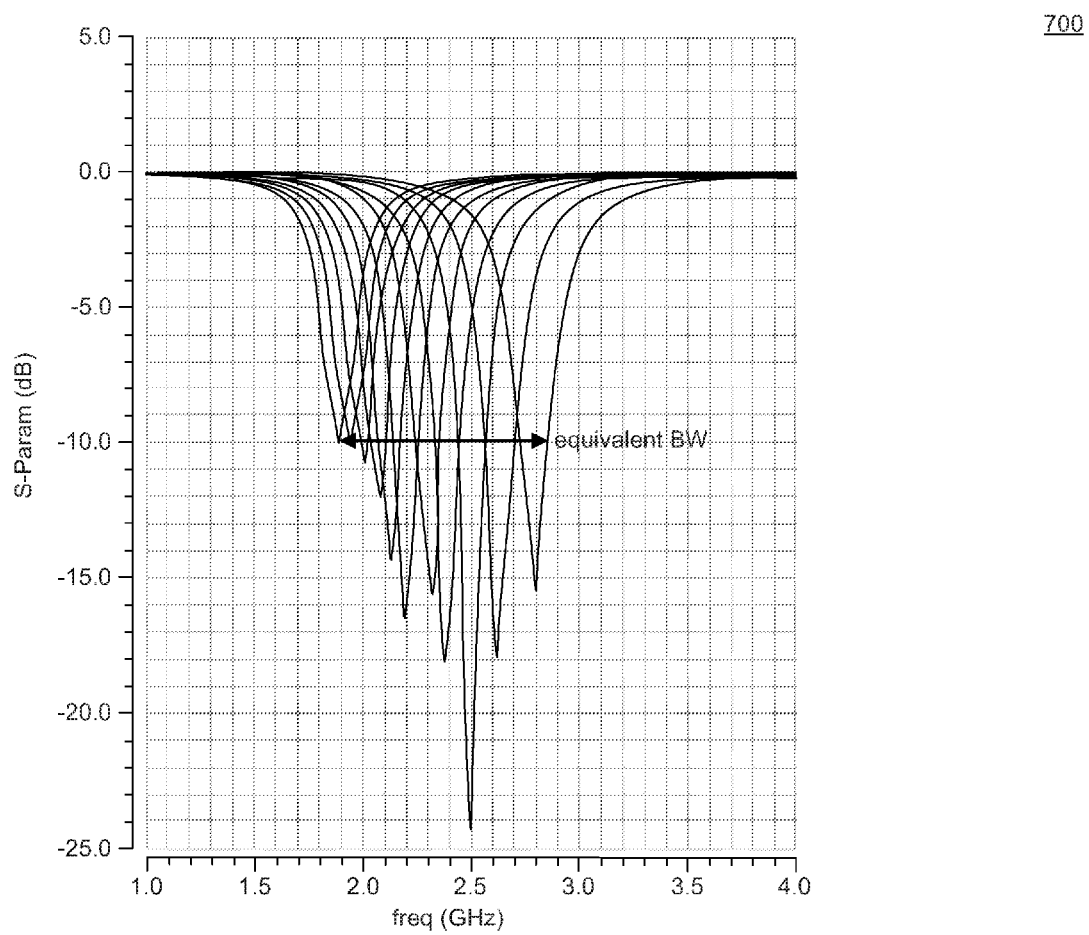
FIG. 7 illustrates the return loss for various frequencies centered on 2.5 GHz, in accordance with some embodiments.

Simulations were performed for an embodiment of switched-capacitor array 410 and switched-resistor array 420 to determine the range of input matching capability. The simulations determined the input reflection coefficients of RF receiver frontend, as illustrated in FIG. 4, over various operating conditions and frequencies of operation. FIG. 7 illustrates the return loss for various frequencies centered on 2.5 GHz. Using a return loss of −10 dB as a minimum requirement, an equivalent bandwidth of approximately 1 GHz centered at 2.5 GHz was determined from the simulations. Therefore, using the switched-capacitor arrays and switched-resistor arrays, the input impedance achieves satisfactory matching conditions for the RF receiver front end in an ultra-low-power operation, i.e., the transistors are operating around the threshold (knee or corner) of the current-voltage transistor characteristics.

A controller such as controller 460 in FIG. 4 may be used in conjunction with a tunable matching circuit. At start-up, the baseband signal output of RF receiver front-end circuit may be measured either at the output of the baseband filter, or further downstream in the processing chain where the signal is larger and/or more accessible. In an embodiment illustrated in FIG. 4, RF sensor 450 may be used to make the measurement. By sequencing through bit values for $B_N$ associated with the switched-capacitor array and $B_P$ associated with the switched resistor array, the level of baseband signal output is measured at each bit value setting. Controller 460 may store all of the bit values $B_N$ and $B_P$ in a digital bit word. In an embodiment, the same bit values for $B_N$ may be used for $B_P$. In the more general case, the bit values for $B_N$ will be different to those bit values for $B_P$. By determining the maximum level of baseband signal output across the range of possible bit value settings, an optimal bit word may be determined for the particular operating environment. The calibration procedure may be repeated on a regular basis to update the digital bit word in response to changes in the operating environment, e.g., changes in temperature of the RF receiver front-end circuit, changes in RF signal conditions, or any other circumstances that would alter the input impedance of the RF receiver front-end circuit.

In summary, the above circuit design provides a flexible approach for a tunable matching circuit design for an ultra-low-power receiver frontend circuit. In embodiments described above, the flexible design approach has been applied to an ultra-low-power receiver frontend circuit that includes a complementary low-noise amplifier (LNA), and I/Q passive down-conversion mixers with 25% duty-cycle local oscillator signals (LO). The tunable matching circuit design approach uses switched-capacitor arrays and switched-resistor arrays are particularly suitable for matching active devices operating under near-threshold-voltage (NTV) operation in an ultra-low-power application. The tunable matching circuit results in an effective match over a significant bandwidth.

Figure 8:
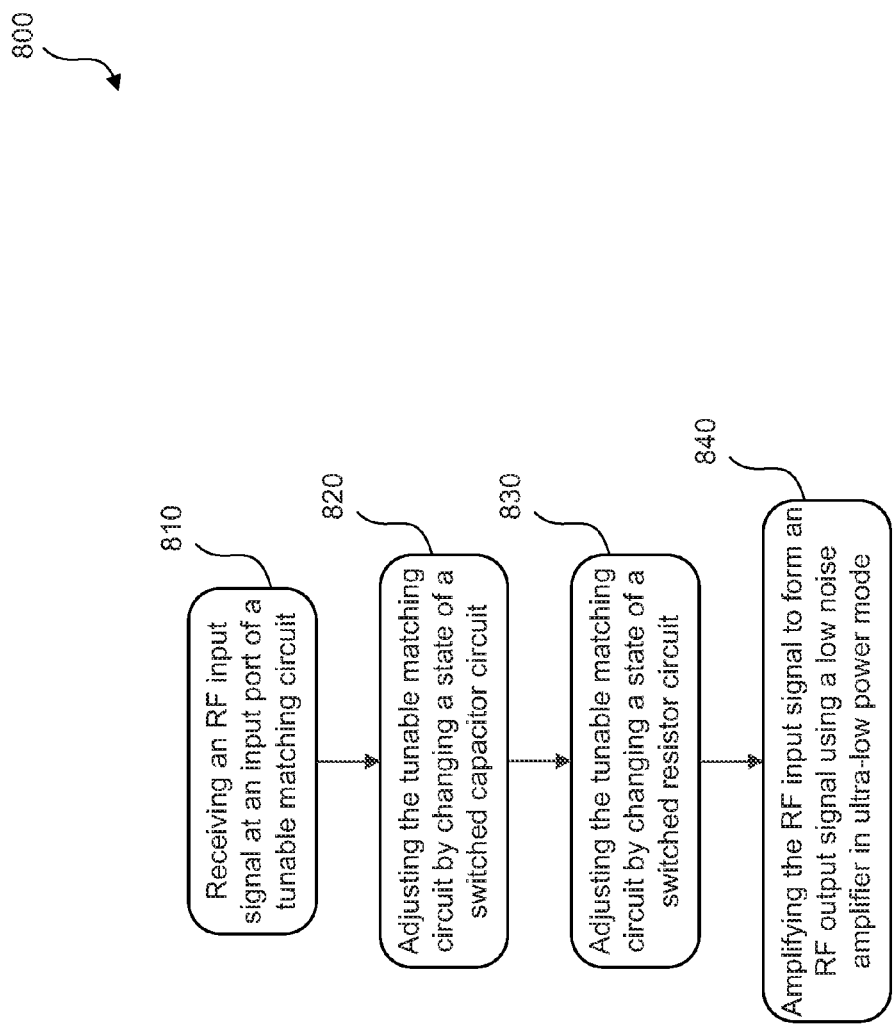
FIG. 8 illustrates an example method, in accordance with some embodiments.

FIG. 8 illustrates a method 800 of matching an RF input signal to a low noise amplifier operating in an ultra-low power mode. Operation 810 receives an RF input signal at an input port of a tunable matching circuit. In one embodiment, the tunable matching circuit is the tunable matching circuit illustrated in FIG. 4. In operation 820, the tunable matching circuit is adjusted by changing a state of a switched capacitor circuit. In one embodiment, the switched capacitor circuit is implemented as illustrated by switched capacitor circuit 410. In operation 830, the tunable matching circuit may also be adjusted by changing a state of a switched resistor circuit. In one embodiment, the switched resistor circuit is implemented as illustrated by switched resistor circuit 420. Operation 840 amplifies the RF input signal to form an RF output signal using a low noise amplifier operating in an ultra-low power mode.

Embodiments of the tunable matching circuit design approach are applicable to ultra-low-power operations at any RF frequencies. In an embodiment, the design approach may be used for ultra-low-power RF receiver front-end circuit for the 2.4 GHz ISM band. In another embodiment, the design approach may be used for ultra-low-power RF receiver front-end circuit for the 5 GHz ISM band. More specifically, the disclosed circuits and methods relate to an ultra-low-power receiver frontend including a complementary low-noise amplifier (LNA), I/Q passive down-conversion mixers with 25% duty-cycle local oscillator signals, and tunable matching networks formed by switched-capacitor arrays and switched-resistor arrays for corner calibration under near-threshold-voltage (NTV) operation, resulting in high matching gain and bandwidth improvement. This tunable matching design approach is particularly useful when transistors (e.g., MOS transistors) are used as the active devices in the LNA. The LNA may comprise a CMOS circuit. CMOS circuits include at least one p-channel transistor and at least one n-channel transistor. Transistors have an exponential I-V relationship that results in a corner or knee in the I-V operational regime.

With the emerging applications of Internet of Things (IOT) and wearable devices, ultra-low-power RF connectivity has attracted considerable importance. In particular RF connectivity using wireless standards such as Bluetooth Low Energy (BLE), ZigBee, 2.4 GHz ISM and 5 GHz frequency bands are widely adopted. Applications involving IOT and wearable devices not only need to support ultra-low-power design approaches but also need to support CMOS semiconductor-based designs that provide the advantages of high-volume integration and low cost.

In some embodiments, a tunable matching circuit has been described that includes an input port, an output port, a switched capacitor circuit, a switched resistor circuit and a low noise amplifier (LNA). The input port receives an RF input signal via an electrical connection having a parasitic inductance. The switched capacitor circuit is coupled to the input port and to ground, and the switched capacitor circuit has a first digital control bit input port. The switched resistor circuit is coupled to the input port and the output port, and the switched resistor circuit has a first digital control bit input port. The low noise amplifier is coupled to the input port and the output port. The LNA is configured to amplify the RF input signal to form an RF output signal. The LNA is further configured to operate in an ultra-low power mode.

In other embodiments, a method is described that includes receiving an RF input signal at an input port of a tunable matching circuit via an electrical connection that has a parasitic inductance. The method further includes adjusting the tunable matching circuit by changing a state of a switched capacitor circuit through receiving input from a first digital control bit input port. The tunable matching circuit is coupled to the input port and to ground. The method further includes adjusting the tunable matching circuit by changing a state of a switched resistor circuit through receiving input from a second digital control bit input port. The tunable matching circuit is coupled to the input port and to an output port. The method further includes amplifying the RF input signal to form an RF output signal by using a low noise amplifier (LNA) coupled to the input port and the output port. The LNA is used in an ultra-low power mode.

In other embodiments, a tunable matching circuit has been described that includes an input port, an output port, a switched capacitor circuit, a switched resistor circuit, a low noise amplifier (LNA), and an in-phase/quadrature down-converter pair. The input port receives an RF input signal via an electrical connection having a parasitic inductance. The switched capacitor circuit is coupled to the input port and to ground, and the switched capacitor circuit has a first digital control bit input port. The switched resistor circuit is coupled to the input port and the output port, and the switched resistor circuit has a first digital control bit input port. The low noise amplifier is coupled to the input port and the output port. The LNA is configured to amplify the RF input signal to form an RF output signal. The LNA is further configured to operate in an ultra-low power mode. The in-phase/quadrature down-converter pair is coupled to the RF output signal and configured to output an in-phase baseband signal and a quadrature baseband signal. The LNA and the in-phase/quadrature down-converter pair are configured to operate in an ultra-low power mode.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A tunable matching circuit, comprising:
   an input port for receiving an RF input signal via an electrical connection having a parasitic inductance;
   an output port;
   a switched capacitor circuit coupled to the input port and to ground, the switched capacitor circuit having a first digital control bit input port;
   a switched resistor circuit coupled to the input port and the output port, the switched resistor circuit having a second digital control bit input port; and
   a low noise amplifier (LNA) coupled to the input port and the output port, the LNA configured to amplify the RF input signal to form an RF output signal, wherein the LNA is configured to operate in an ultra-low power mode.

2. The tunable matching circuit of claim 1, wherein the LNA comprises:
   a first transistor configured to be coupled to a positive DC power supply, the first transistor being a p-channel field effect transistor (FET); and
   a second transistor in series with the first transistor, the second transistor being an n-channel FET that is configured to be coupled to the ground,
   wherein the first transistor and the second transistor share a first common node and a second common node, the first common node coupled to the input port, and the second common node coupled to the output port.

3. The tunable matching circuit of claim 1, wherein the switched capacitor circuit comprises:
   a first capacitor coupled between the input port and the ground;
   a transistor switch coupled to the ground, the transistor switch coupled to the first digital control bit input port; and
   a second capacitor coupled to the input port and the transistor switch.

4. The tunable matching circuit of claim 3, wherein the switched capacitor circuit further comprises:
   a second transistor switch coupled to the ground, the second transistor switch coupled to the first digital control bit input port; and
   a resistor coupled to the second transistor switch, the transistor switch and the second capacitor.

5. The tunable matching circuit of claim 1, wherein the switched resistor circuit comprises:
   a first resistor coupled to the input port and the output port;
   a series combination of a transistor switch and a second resistor, wherein the series combination is coupled to the input port and the output port, and wherein the transistor switch is coupled to the second digital control bit input port.

6. The tunable matching circuit of claim 1, further comprising:
   a controller coupled to an RF sensor and coupled to the first digital control bit input port and the second digital control bit input port,
   wherein the controller is configured to determine a power level of the RF output level, and to determine a first digital bit value and a second digital bit value based on the determined power level, the first digital bit value and the second digital bit value being supplied to the first digital control bit input port and the second digital control bit input port respectively.

7. The tunable matching circuit of claim 6, further comprising:
a memory component configured to store at least one digital control word, the digital control word comprising the first digital bit value and the second digital bit value.

8. The tunable matching circuit of claim 7, wherein the controller is further configured to receive an indication of an operating frequency, and the memory component is further configured to store the indication of the operating frequency.

9. The tunable matching circuit of claim 1, wherein the LNA comprises at least one p-channel transistor and at least one n-channel transistor.

10. A method, comprising:
receiving an RF input signal at an input port of a tunable matching circuit via an electrical connection having a parasitic inductance;
adjusting the tunable matching circuit by changing a state of a switched capacitor circuit through receiving input from a first digital control bit input port, the tunable matching circuit being coupled to the input port and to ground;
adjusting the tunable matching circuit by changing a state of a switched resistor circuit through receiving input from a second digital control bit input port, the tunable matching circuit being coupled to the input port and to an output port; and
amplifying the RF input signal to form an RF output signal by using a low noise amplifier (LNA) coupled to the input port and the output port, wherein the LNA is used in an ultra-low power mode.

11. The method of claim 10, wherein the amplifying further comprises:
powering a first transistor and a second transistor by a DC power supply, wherein the second transistor is in series with the first transistor, the second transistor is coupled to the ground, and wherein the first transistor and the second transistor share a first common node and a second common node, the first common node coupled to the input port, and the second common node coupled to the output port.

12. The method of claim 10, wherein changing the state of the switched capacitor circuit further comprises:
turning on a transistor switch in response to receiving the input from the first digital control bit input port, the transistor switch thereby coupling a second capacitor between the input port and the ground, the second capacitor being placed in parallel with a first capacitor that is coupled between the input port and the ground.

13. The method of claim 12, wherein changing the state of the switched capacitor circuit further comprises:
turning on a second transistor switch in response to receiving the input from the first digital control bit input port coupled to the ground, the second transistor switch thereby coupling the second capacitor to ground via a resistor.

14. The method of claim 10, wherein changing the state of the switched resistor circuit further comprises:
turning on a transistor switch in response to receiving an input from the second digital control bit input port, the transistor switch thereby coupling a second resistor in parallel with a first resistor, wherein the first resistor is coupled to the input port and the output port.

15. The method of claim 10, further comprising:
determining, by an RF sensor, a power level of the RF output level;
determining, by a controller, a first digital bit value and a second digital bit value based on the determined power level; and
supplying the first digital bit value and the second digital bit value being supplied to the first digital control bit input port and the second digital control bit input port respectively.

16. The method of claim 15, further comprising:
storing, in a memory component, at least one digital control word, the digital control word comprising the first digital bit value and the second digital bit value.

17. The method of claim 16, further comprising:
receiving, by the controller, an indication of an operating frequency; and
storing, in the memory component, the indication of the operating frequency.

18. The method of claim 17, wherein using the LNA includes using at least one p-channel transistor and at least one n-channel transistor.

19. A tunable matched RF receiver circuit, comprising:
an input port for receiving an RF input signal via an electrical connection having a parasitic inductance;
an output port;
a switched capacitor circuit coupled to the input port and to ground, the switched capacitor circuit having a first digital control bit input port;
a switched resistor circuit coupled to the input port and the output port, the switched resistor circuit having a second digital control bit input port;
a low noise amplifier (LNA) coupled to the input port and the output port, the LNA configured to amplify the RF input signal to form an RF output signal; and
an in-phase/quadrature down-converter pair coupled to the RF output signal and configured to output an in-phase baseband signal and a quadrature baseband signal, wherein the LNA and the in-phase/quadrature down-converter pair are configured to operate in an ultra-low power mode.

20. The tunable matched RF receiver circuit of claim 19, wherein the ultra-low power mode is configured to operate at least one transistor in the LNA at a knee in a voltage-current characteristic.

* * * * *